United States Patent
Fan et al.

(10) Patent No.: US 10,347,506 B2
(45) Date of Patent: Jul. 9, 2019

(54) MULTIPLE PATTERNING METHOD USING MASK PORTIONS TO ETCH SEMICONDUCTOR SUBSTRATE

(71) Applicant: Taiwan Semiconductor Manufacturing Co., Ltd., Hsinchu (TW)

(72) Inventors: Cheng-Li Fan, New Taipei (TW); Chih-Hao Chen, Hsinchu (TW); Wen-Yen Chen, Chu Tung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/833,077

(22) Filed: Dec. 6, 2017

(65) Prior Publication Data

US 2019/0035638 A1 Jan. 31, 2019

Related U.S. Application Data

(60) Provisional application No. 62/539,144, filed on Jul. 31, 2017.

(51) Int. Cl.
*H01L 21/311* (2006.01)
*H01L 21/768* (2006.01)

(52) U.S. Cl.
CPC .. *H01L 21/31144* (2013.01); *H01L 21/76802* (2013.01); *H01L 21/76877* (2013.01)

(58) Field of Classification Search
CPC ......... H01L 21/31144; H01L 21/76802; H01L 21/76877; H01L 21/0338; H01L 21/0332; H01L 21/0335; H01L 21/0337; H01L 21/76816
See application file for complete search history.

(56) References Cited

U.S. PATENT DOCUMENTS

| 8,966,412 | B1 | 2/2015 | Yuan et al. |
| 9,818,613 | B1 | 11/2017 | Huang et al. |
| 10,002,786 | B1 * | 6/2018 | Licausi ............. H01L 23/53242 |

(Continued)

FOREIGN PATENT DOCUMENTS

| TW | 201514741 A | 4/2015 |
| TW | 201532190 A | 8/2015 |

(Continued)

*Primary Examiner* — Michael Jung
(74) *Attorney, Agent, or Firm* — Slater Matsil, LLP

(57) ABSTRACT

Methods for patterning in a semiconductor process are described. A dummy layer is formed having a cut therein. A first sacrificial layer is formed over the dummy layer, and at least a portion of the first sacrificial layer is disposed in the cut. A second sacrificial layer is formed over the first sacrificial layer. The second sacrificial layer is patterned to have a first pattern. Using the first pattern of the second sacrificial layer, the first sacrificial layer is patterned to have the first pattern. The second sacrificial layer is removed. Thereafter, a second pattern in the first sacrificial layer is formed comprising altering a dimension of the first pattern of the first sacrificial layer. Using the second pattern of the first sacrificial layer, the dummy layer is patterned. Mask portions are formed along respective sidewalls of the patterned dummy layer. The mask portions are used to form a mask.

20 Claims, 15 Drawing Sheets

(56) References Cited

U.S. PATENT DOCUMENTS

| | | | |
|---|---|---|---|
| 2014/0300000 A1* | 10/2014 | Chao | H01L 21/76816 438/667 |
| 2016/0064248 A1* | 3/2016 | Lee | H01L 21/76816 438/637 |
| 2016/0225666 A1* | 8/2016 | Bouche | H01L 21/31144 |
| 2016/0293478 A1 | 10/2016 | Yuan et al. | |

FOREIGN PATENT DOCUMENTS

| | | |
|---|---|---|
| TW | 201637130 A | 10/2016 |
| TW | 201816846 A | 5/2018 |

* cited by examiner

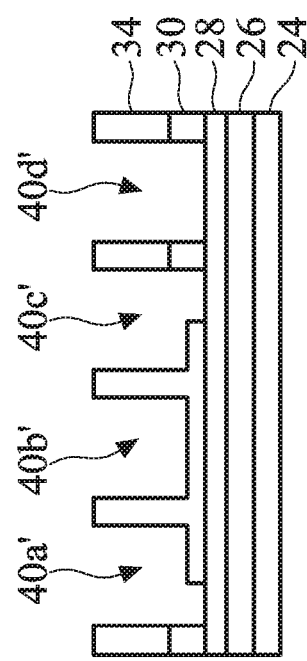
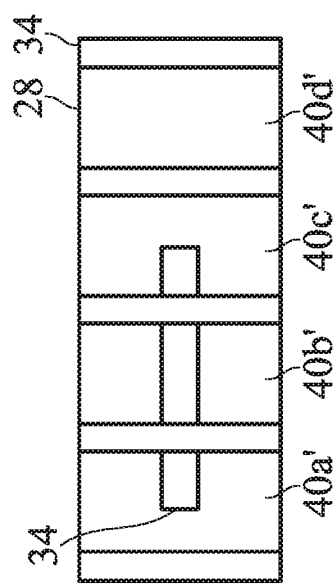
FIG. 7A
FIG. 7B

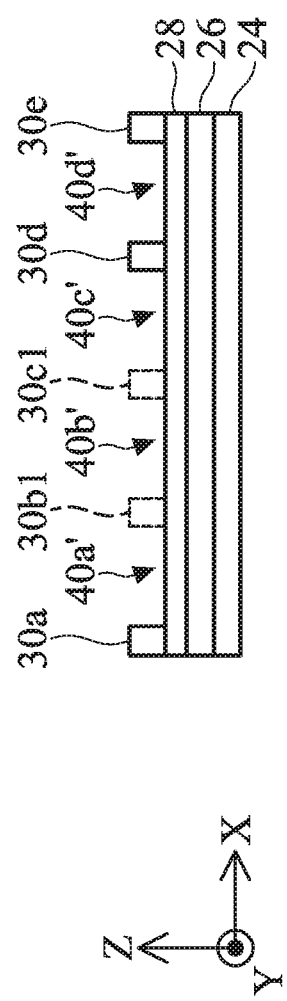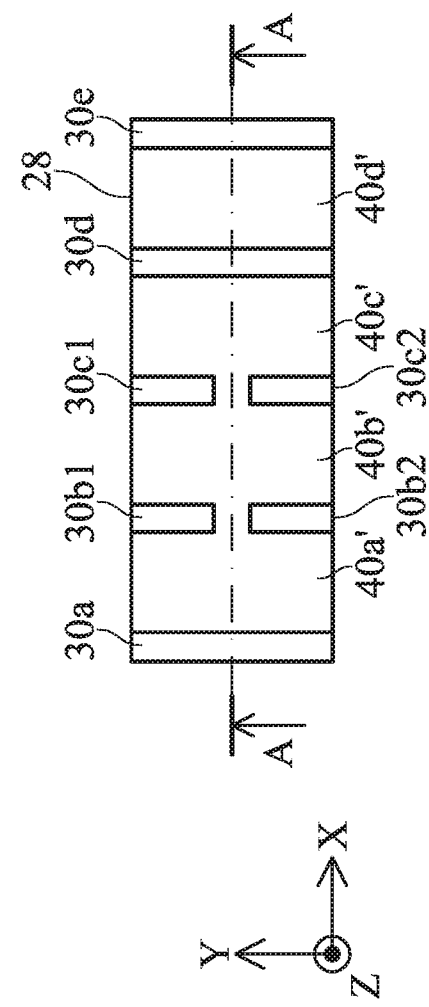

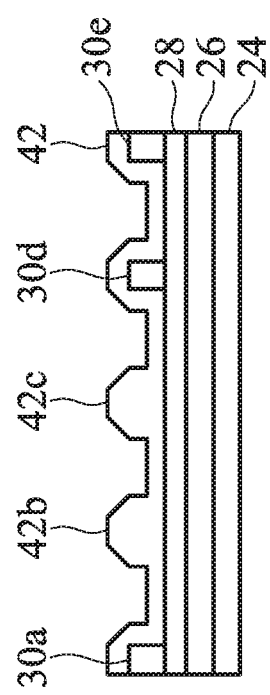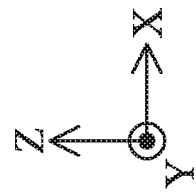
FIG. 9A
FIG. 9B

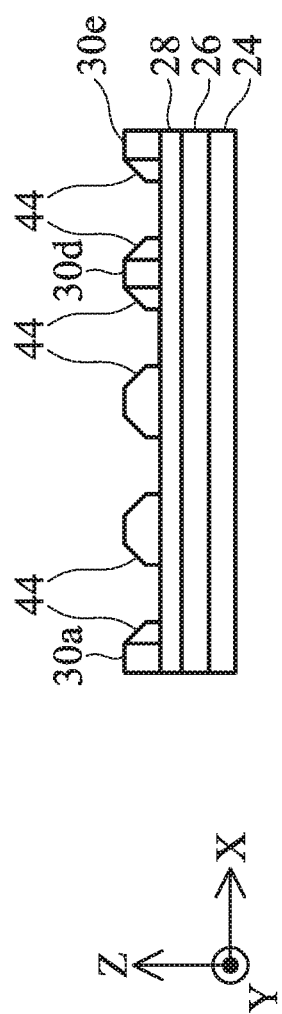
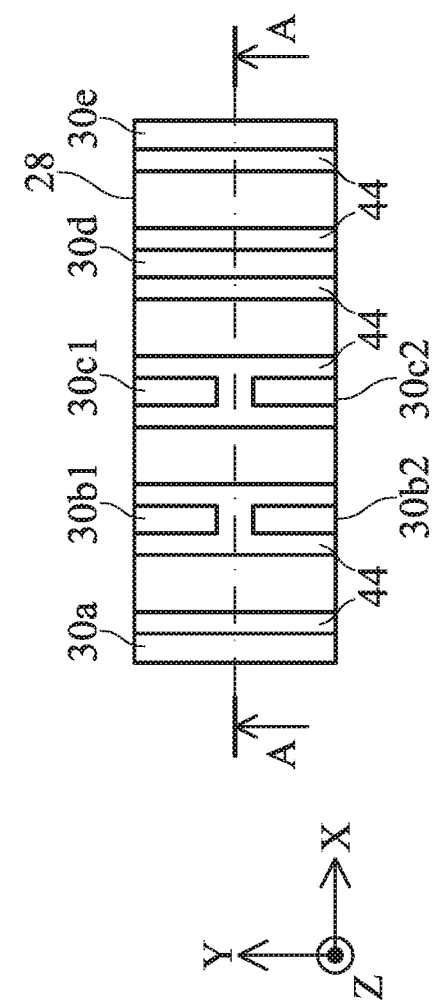

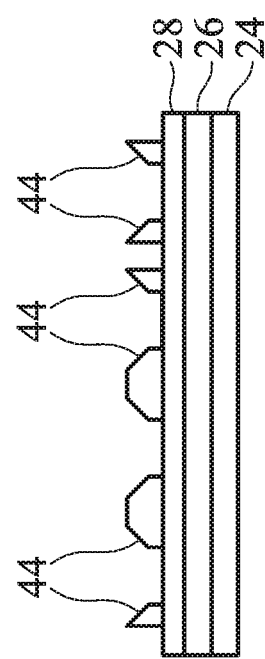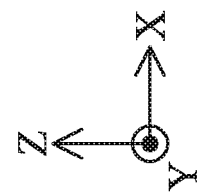
FIG. 11A
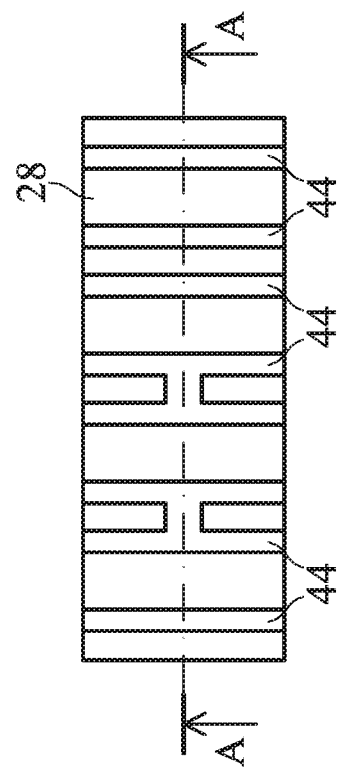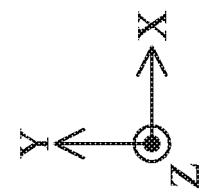
FIG. 11B

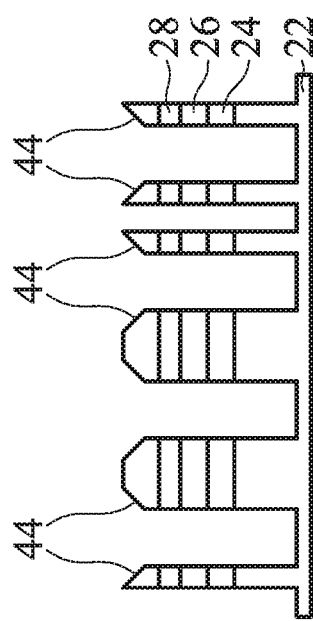
FIG. 12A
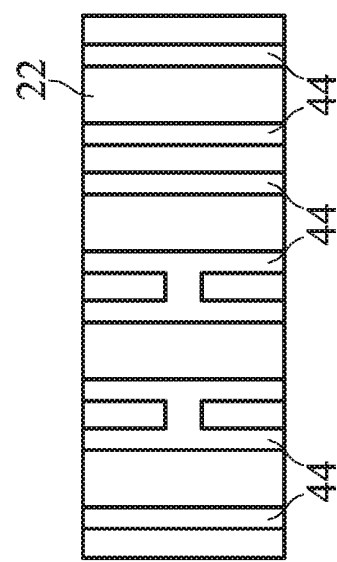
FIG. 12B
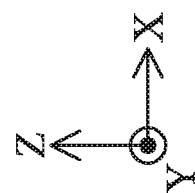
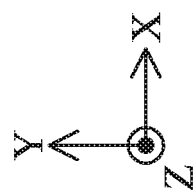

MULTIPLE PATTERNING METHOD USING MASK PORTIONS TO ETCH SEMICONDUCTOR SUBSTRATE

PRIORITY CLAIM AND CROSS-REFERENCE

This application claims the benefit of and priority to U.S. Provisional Patent Application Ser. No. 62/539,144, filed on Jul. 31, 2017, entitled "Patterning Method," which is incorporated herein by reference in its entirety.

BACKGROUND

Double patterning is a technology developed for lithography to enhance feature density in integrated circuits. Typically, the lithography technology is used for forming features of integrated circuits on wafers. The lithography technology involves applying a photo resist and defining patterns in the photo resist. The patterns in the photo resist are first defined in a lithography mask, and are implemented either by the transparent portions or by the opaque portions of the lithography mask. The patterns in the lithography mask are transferred to the photo resist through an exposure using the lithography mask, followed by the development of the photo resist. The patterns in the patterned photo resist are then transferred to the manufactured features, which are formed on a wafer.

Various techniques have been created to implement double or multiple patterning. One technique is a lithography-etch-lithograph-etch (LELE) technique. In a LELE technique, a pattern is generally divided into multiple parts to be implemented using multiple, respective lithography followed by etch steps. Another technique is a self-aligned technique. In a self-aligned technique, a pattern is generally formed by forming a mandrel and spacers on sidewalls of the mandrel, where the spacers are the pattern to be formed in the underlying substrate. In these techniques, the goal is to decrease a width between neighboring features, thereby increasing density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, and 13B are views of intermediate structures during respective stages of a method for forming conductive features in a dielectric layer using, for example, a self-aligned double patterning technique, in accordance with some embodiments.

DETAILED DESCRIPTION

Figure 1A:
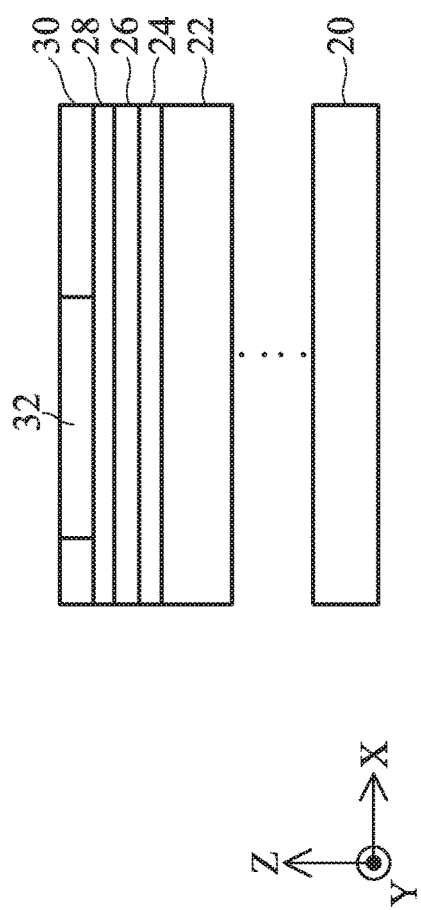

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments described herein relate generally to one or more methods of patterning one or more layers on a semiconductor substrate and/or the semiconductor substrate itself. Generally, a step to alter (e.g., reduce or trim) a dimension of features can be performed on a patterned bottom layer, such as described in more detail below. By altering dimensions on the patterned bottom layer, a photo resist may maintain a higher aspect ratio, which in turn, may permit more robust processing whereby the photo resist may avoid collapsing. Further, by altering dimensions on the patterned bottom layer, various other layers may be better protected from etching processes, which might otherwise cause abnormalities in patterns or other features.

Some embodiments described herein are in the context of self-aligned double patterning (SADP). Other embodiments may be applied in other contexts, such as self-aligned quadruple patterning (SAQP) or other patterning techniques. Various multiple patterning technologies have been developed to overcome physical resolutions that may be achieved by conventional lithography. Self-aligned double patterning may be implemented to create features with dimensions and sizes that are smaller than the physical resolution of conventional lithography, for example. This can enable smaller devices and increased density on a chip.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1A-B through 13A-B illustrate intermediate structures during respective stages of an example method for forming conductive features in a dielectric layer using, for example, a self-aligned double patterning technique, in accordance with some embodiments. These figures illustrate x-y-z axes to facilitate understanding of different view-point references in the figures. Additionally, FIGS. 14A and 14B is a flow chart of the example method for forming conductive features in a dielectric layer using, for example, a self-aligned double patterning technique, in accordance with some embodiments.

Figure 1B:
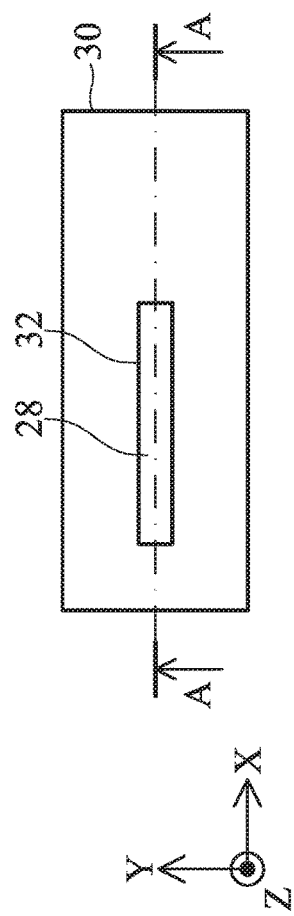

FIGS. 1A and 1B illustrate an intermediate structure during processing. FIG. 1A illustrates a cross-section view of the intermediate structure. FIG. 1B illustrates a top view of the intermediate structure shown in FIG. 1A, with the cross-section of FIG. 1A being at the line A-A. The intermediate structure includes a semiconductor substrate 20. The semiconductor substrate 20 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof. Moreover, the semiconductor substrate 20 is not limited to any particular size, shape or materials. The semiconductor substrate 20 may be a round/circular substrate having a 200 mm diameter, a 300 mm diameter, 450 mm diameter, or other diameters. The semiconductor substrate 20 may also be any polygonal, square, rectangular, curved or otherwise non-circular workpiece, such as a polygonal glass substrate.

A dielectric layer 22 is above the semiconductor substrate 20. The dielectric layer 22 may be directly on the semiconductor substrate 20, or any number of other layers may be disposed between the dielectric layer 22 and the semiconductor substrate 20. For example, the dielectric layer 22 may be or include an Inter-Layer Dielectric (ILD) or an Inter-Metal Dielectric (IMD). The dielectric layer 22, for example, may be or comprise a low-k dielectric having a k-value less than about 4.0, such as about 2.0 or even less. In some examples, the dielectric layer 22 is or comprises phosphosilicate glass (PSG), borophosphosilicate glass (BPSG), fluorosilicate glass (FSG), SiOxCy, Spin-On-Glass, Spin-On-Polymers, silicon carbon material, a compound thereof, a composite thereof, or a combination thereof. The dielectric layer 22 may be deposited using a Chemical Vapor Deposition (CVD), such as Plasma Enhanced CVD (PECVD) or Flowable CVD (FCVD); spin-on coating; or another deposition technique. In some examples, a Chemical Mechanical Planarization (CMP) or another planarization process may be performed to planarize the top surface of dielectric layer 22. The dielectric layer 22 can have a thickness in a range from about 30 nm to about 70 nm, for example.

Further, although not illustrated, an etch stop layer may be disposed in, or below and adjoining, the dielectric layer 22. Generally, an etch stop layer can provide a mechanism to stop an etching process when forming, e.g., contacts or vias. An etch stop layer may be formed of a dielectric material having a different etch selectivity from adjacent layers, for example, the dielectric layer 22. The etch stop layer may have a different etch selectivity, and hence, be an etch stop, for the etch process used to form recesses and/or openings in the dielectric layer 22 for conductive features as described herein. The etch stop layer may be conformally deposited over the semiconductor substrate 20 (and/or any intervening structures and layers formed thereover). The etch stop layer may comprise or be silicon nitride, silicon carbon nitride, silicon carbon oxide, carbon nitride, the like, or a combination thereof, and may be deposited by CVD, PECVD, ALD, or another deposition technique.

Various devices may be on the semiconductor substrate 20, which may be and/or become interconnected through the dielectric layer 22 and/or other dielectric layers. For example, the semiconductor substrate 20 may include Field Effect Transistors (FETs), such as Fin FETs (FinFETs), planar FETs, vertical gate all around FETs (VGAA FETs), horizontal gate all around FETs (HGAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Patterning described herein may be used in the processing to, for example, interconnect the devices to form an integrated circuit. The integrated circuit can be any circuit, such as for an Application Specific Integrated Circuit (ASIC), a processor, memory, or other circuit.

As shown in FIGS. 1A and 1B, and in operation 102 of FIG. 14A, a mask stack is formed above the dielectric layer 22. The mask stack includes a first mask sub-layer 24, a second mask sub-layer 26, and a third mask sub-layer 28. In other examples, the mask stack may be or include one layer or any number of different layers. The first mask sub-layer 24 is above the dielectric layer 22. The second mask sub-layer 26 is above the first mask sub-layer 24. The third mask sub-layer 28 is above the second mask sub-layer 26.

The first mask sub-layer 24 may be or comprise an Anti-Reflective Coating (ARC), such as a Nitrogen-Free Anti-Reflective Coating (NFARC) (e.g., a silicon-rich oxide (SRO)), or the like, and may be formed using CVD, Physical Vapor Deposition (PVD), Atomic Layer Deposition (ALD), or another deposition technique. The first mask sub-layer 24 can have a thickness in a range from about 2 nm to about 15 nm, for example. The second mask sub-layer 26 may be or comprise a nitride layer, such as titanium nitride (TiN), silicon nitride (SiN), tantalum nitride (TaN), the like, or a combination thereof, and may be formed using CVD, PVD, ALD, or another deposition technique. The second mask sub-layer 26 can have a thickness in a range from about 20 nm to about 50 nm, for example. The third mask sub-layer 28 may be or comprise an oxide layer, such as tetraethylorthosilicate (TEOS), the like, or a combination thereof, and may be formed using CVD, PVD, ALD, or another deposition technique. The third mask sub-layer 28 can have a thickness in a range from about 10 nm to about 50 nm, for example.

As shown in FIGS. 1A and 1B, and in operation 104 of FIG. 14A, a dummy mask layer 30 with a cut 32 is formed above the mask stack (e.g., above the third mask sub-layer 28). The dummy mask layer 30 may be or comprise a silicon layer, such as an amorphous silicon layer, the like, or a combination thereof. The dummy mask layer 30 may be formed using CVD, PVD, ALD, or another deposition technique. The dummy mask layer 30 can have a thickness in a range from about 30 nm to about 70 nm, for example.

The cut 32 (e.g., or opening) is formed through the dummy mask layer 30. The cut 32 may be formed using an appropriate photolithography technique and etching. For example, a photo resist can be formed on the dummy mask layer 30, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the dummy mask layer 30, such as by using a suitable etch process. The etch process may include a reactive ion etch (RIE), neutral beam etch (NBE), the like, or a combination thereof. The etching may be anisotropic. Subsequently, the photo resist is removed in an ashing and/or wet strip processes, for example. As will become apparent from subsequent figures and description, the cut 32 corresponds to an area where some conductive features formed in the dielectric layer 22 and laterally intersecting the cut 32 will be discontinuous in respective y-directions.

In subsequent figures, the semiconductor substrate 20, the dielectric layer 22, and line A-A may be omitted to avoid obscuring features illustrated in those figures. A person having ordinary skill in the art will readily understand that the semiconductor substrate 20 and the dielectric layer 22 are nevertheless present in the structures illustrated in those figures, and will readily understand the reference point of line A-A in those figures.

Figure 2A:
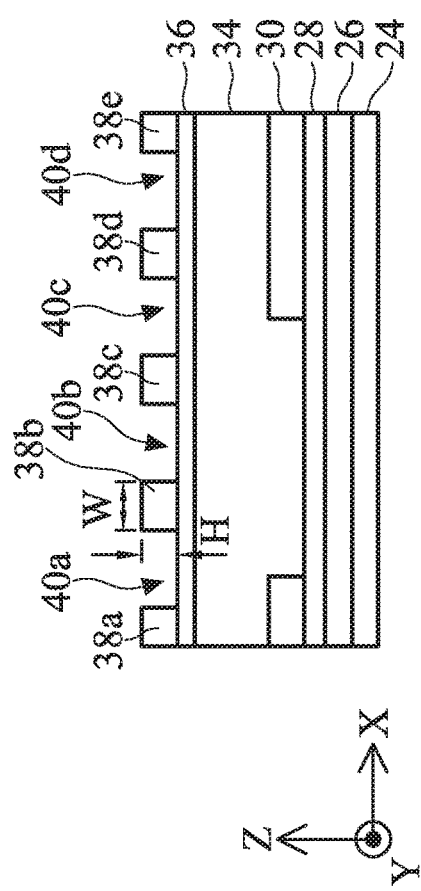
Figure 2B:
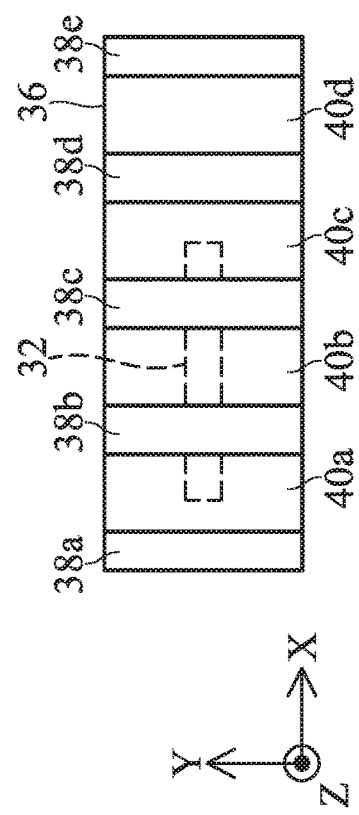

FIGS. 2A and 2B illustrate the intermediate structure of FIGS. 1A and 1B after further processing. FIGS. 2A and 2B illustrate a cross-section view and a top view, respectively, like in FIGS. 1A and 1B. In FIGS. 2A and 2B, and operation 106 of FIG. 14A, a bottom layer 34 (e.g., a sacrificial layer) is formed above the dummy mask layer 30 and in the cut 32. The bottom layer 34 may be or comprise a hard mask material, such as a carbon-containing material, and may be formed using spin-on coating, CVD, PVD, ALD, or another deposition technique. In an example, the bottom layer 34 is a polymer material, such as an oxide, formed by spin-on coating. In some examples, the bottom layer 34 may be planarized after being deposited, such as by CMP or another planarization process. The bottom layer 34 can have a thickness (e.g., in an area outside of the cut 34) in a range from about 20 nm to about 150 nm, for example.

Further, in FIGS. 2A and 2B, and operation 108 of FIG. 14A, a middle layer 36 (e.g., a sacrificial layer) is formed above the bottom layer 34. The middle layer 36 may be or comprise another mask material, such as a carbon-containing material like silicon oxycarbide (SiOC), and may be formed using CVD, PVD, ALD, or another deposition technique. In an example, the middle layer 36 is SiOC. The middle layer 36 can have a thickness in a range from about 10 nm to about 40 nm, for example.

Further, in FIGS. 2A and 2B, and operation 110 of FIG. 14A, a photo resist 38 is formed above the middle layer 36, such as by using spin-on coating, and is patterned by exposing the photo resist 38 to light using an appropriate photomask. Exposed or unexposed portions of the photo resist may then be removed depending on whether a positive or negative resist is used. Patterned line photo resist portions 38a-e remain above the middle layer 36. Areas where portions of the photo resist 38 were removed form line areas 40a-d that expose corresponding portions of the middle layer 36. The line areas 40a-d can each have a spacing (e.g., a dimension in a y-direction between neighboring patterned line photo resist portions 38a-e) that is in a range from about 10 nm to about 80 nm, for example. The patterned line photo resist portions 38a-e may each have an aspect ratio that is sufficient to mitigate against collapse of the patterned line photo resist portions 38a-e during one or more subsequent etch processes. Each of the patterned line photo resist portions 38a-e may have, such as illustrated for the patterned line photo resist portion 38b, a height H and a width W, and may further have an aspect ratio (e.g., the height H to the width W) less than or equal to about 5.5, such as in a range from about 0.1 to about 5.

Figure 3A:
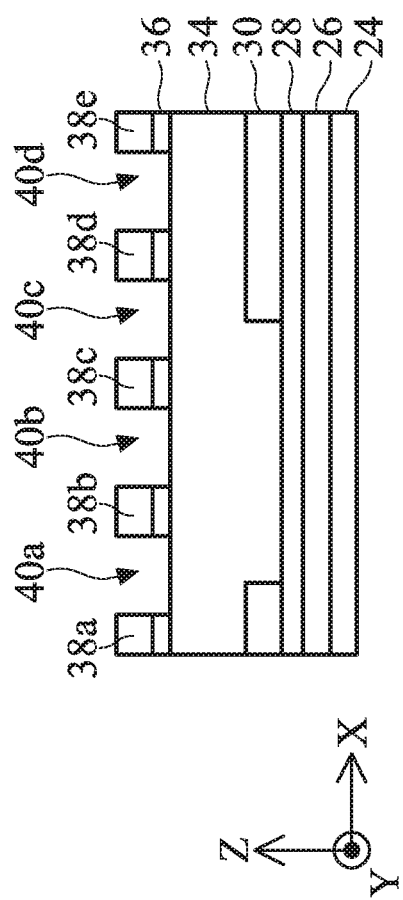
Figure 3B:
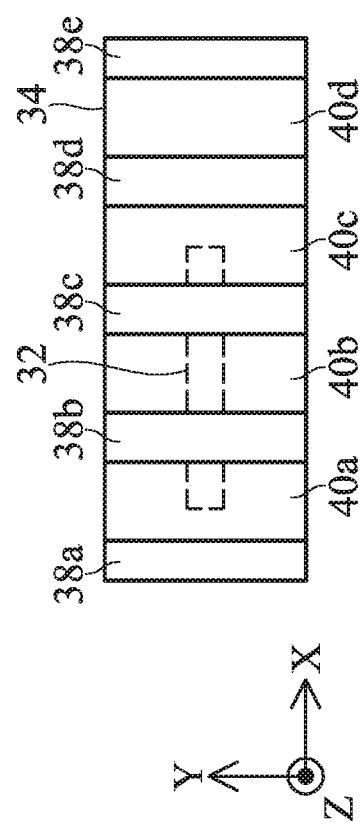

FIGS. 3A and 3B illustrate the intermediate structure of FIGS. 2A and 2B after further processing. FIGS. 3A and 3B illustrate a cross-section view and a top view, respectively, like in FIGS. 2A and 2B. In FIGS. 3A and 3B, and operation 112 of FIG. 14A, an etch process is performed that transfers the pattern of the patterned line photo resist portions 38a-e to the underlying middle layer 36. Areas where portions of the middle layer 36 were removed similarly have the line areas 40a-d that expose corresponding portions of the bottom layer 34. The etch process can be any suitable etch process, such as RIE, NBE, the like, or a combination thereof. During this etch process, the patterned line photo resist portions 38a-e may each have an aspect ratio that is sufficiently small to mitigate collapse, such as an aspect ratio of less than or equal to about 5.5, such as in a range from about 0.1 to about 5. Subsequently, the photo resist 38 (e.g., photo resist portions 38a-e) may be removed in an ashing and/or wet strip processes, for example.

Figure 4A:
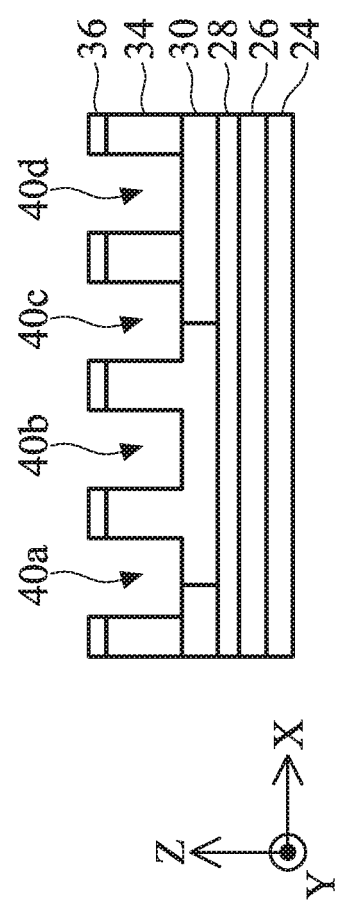
Figure 4B:
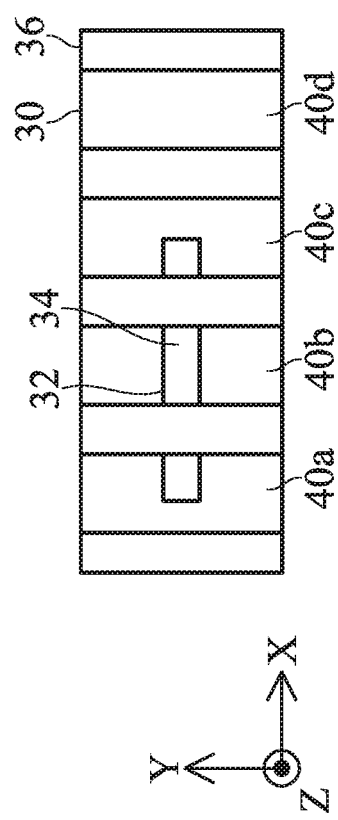

FIGS. 4A and 4B illustrate the intermediate structure of FIGS. 3A and 3B after further processing. FIGS. 4A and 4B illustrate a cross-section view and a top view, respectively, like in FIGS. 3A and 3B. In FIGS. 4A and 4B, and operation 114 of FIG. 14A, an etch process is performed that transfers the pattern of the patterned middle layer 36 to the underlying bottom layer 34. Areas where portions of the middle layer 36 were removed similarly have the line areas 40a-d that expose corresponding portions of the dummy mask layer 30 and/or a portion of the bottom layer 34 disposed in the cut 32. The etch process can be any suitable etch process, such as RIE, NBE, the like, or a combination thereof. The etch process may be controlled, e.g. timed, such that the portion of the bottom layer 34 disposed in the cut 32 remains while portions of the dummy mask layer 30 are exposed, although the portion of the bottom layer 34 disposed in the cut 32 may be etched to a depth below a top surface of the dummy mask layer 30.

Figure 5A:
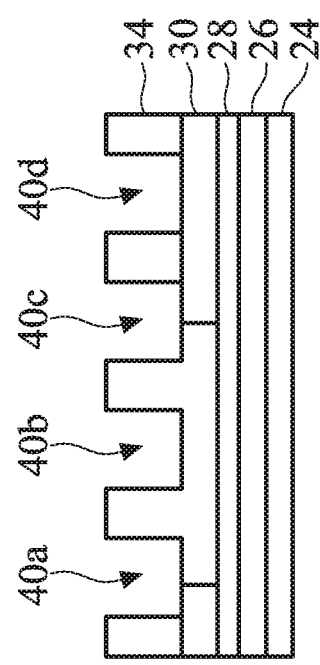
Figure 5B:
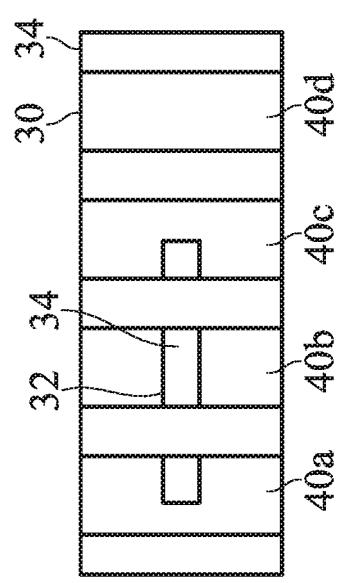

FIGS. 5A and 5B illustrate the intermediate structure of FIGS. 4A and 4B after further processing. FIGS. 5A and 5B illustrate a cross-section view and a top view, respectively, like in FIGS. 4A and 4B. In FIGS. 5A and 5B, and operation 116 of FIG. 14A, an etch process is performed that removes the patterned middle layer 36. The etch process can be any suitable etch process selective to etch the material of the patterned middle layer. For example, the etch process can be a plasma-based etch, such as an RIE, the like or a combination thereof. In some examples, the etch process does not significantly etch the patterned bottom layer 34 and portion of the bottom layer 34 disposed in the cut 32. In some examples, a ratio of the selectivity of the etch process between the middle layer 36 to the bottom layer 34 can be greater than one, greater than about ten, greater than about fifty (such as infinite), or other selectivities. In some examples, a ratio of the selectivity of the etch process between the middle layer 36 to the third mask sub-layer 28 can be greater than two, greater than four, greater than ten, greater than one hundred, or other selectivities.

In an example, the middle layer 36 is SiOC; the bottom layer 34 is a polymer oxide; the dummy mask layer 30 is amorphous silicon; and the third mask sub-layer 28 is TEOS. In this example, a plasma etch can be used to remove the patterned middle layer 36. The plasma etch can include a combination of nitrogen ($N_2$) gas, argon (Ar) gas, hydrogen ($H_2$) gas, carbon tetrafluoride ($CF_4$) gas, and fluoroform ($CHF_3$) gas. For example, a ratio of flow rates of the gases in the combination may be in the ranges of (20 standard cubic centimeter per minute (sccm) to 100 sccm):(10 sccm to 100 sccm):(70 sccm to 200 sccm):(30 sccm to 150 sccm):(5 sccm to 80 sccm) ($N_2$:Ar:$H_2$:$CF_4$:$CHF_3$). In some embodiments, a ratio of flow rates of $N_2$:Ar:$H_2$:($CF_4$+$CHF_3$) is about 1:1:2:3. In this example using this plasma etch, the etch rate of the middle layer 36 may be approximately 26 angstroms per second (A/s); the etch rate of the bottom layer 34 maybe approximately −1.127 Å/s; and the etch rate of the third mask sub-layer 28 maybe approximately 12.573 Å/s. Hence, in this example, the etch selectivity of the middle layer 36 to the bottom layer 34 may be high, such as infinite, and the etch selectivity of the middle layer 36 to the third mask sub-layer 28 may be high, such as approximately 2.07. If, therefore in this example, the portion of the bottom layer 34 has been removed and/or experienced some loss in the cut 32, the third mask sub-layer 28 may not be significantly etched because the etch selectivity between the middle layer 36 and the third mask sub-layer 28 during the plasma etch may be higher compared to other etch processes.

Figure 6A:
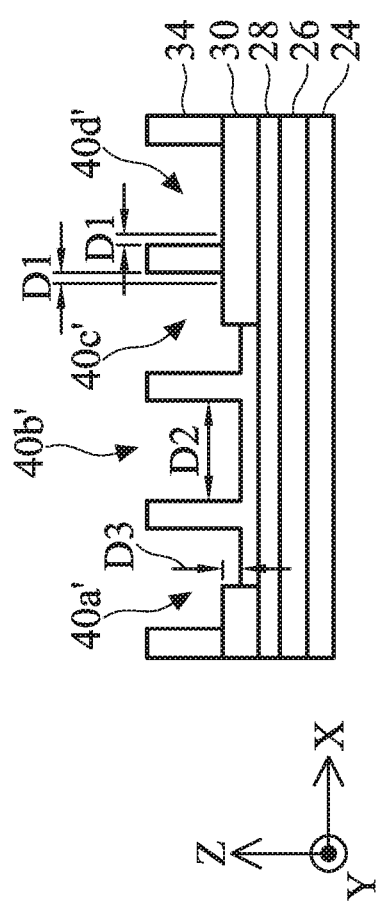
Figure 6B:
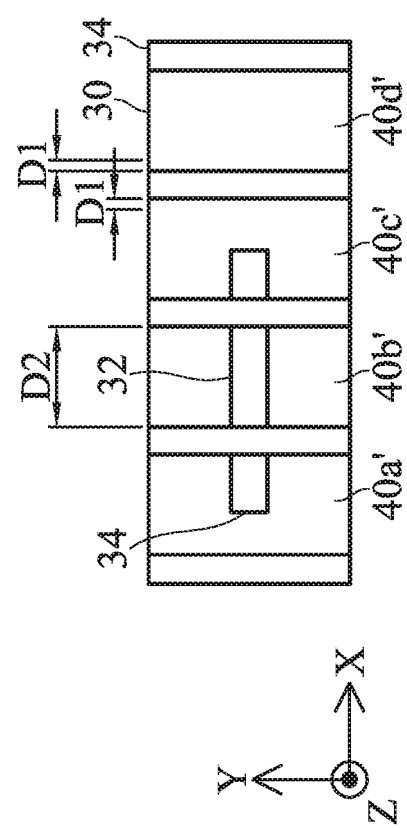

FIGS. 6A and 6B illustrate the intermediate structure of FIGS. 5A and 5B after further processing. FIGS. 6A and 6B illustrate a cross-section view and a top view, respectively, like in FIGS. 5A and 5B. In FIGS. 6A and 6B, and operation 118 of FIG. 14A, dimensions of features of the intermediate structure are altered. For example, an isotropic etch, which may be a plasma etch, may be performed that is selective to the material of the patterned bottom layer 34 and that etches horizontal and vertical surfaces of the patterned bottom layer 34 at substantially equal rates. Accordingly, in the illustrated example, respective lateral dimensions (e.g., in an x-direction) of patterned portions of the bottom layer 34 can be reduced (e.g., trimmed) by two times a first dimension D1. Correspondingly, with the lateral dimensions of the patterned portions of the bottom layer 34 being reduced, respective lateral dimensions of the line areas 40a-d are increased by two times the first dimension D1 to obtain modified line areas 40a'-d' that have a second dimension D2. The second dimension D2 is a spacing between facing sidewalls of neighboring ones of patterned portions of the bottom layer 34. The first dimension D1 can be in a range from about 0.5 nm to about 3 nm, in some examples, and the second dimension D2 can be in a range from about 1 nm to about 6 nm, in some examples.

Additionally, the portion of the bottom layer 34 disposed in the cut 32 can be etched vertically by the first dimension D1. An upper surface of the portion of the bottom layer 34 disposed in the cut 32 can have a step difference D3 relative to a top surface of the dummy mask layer 30 that is equal to or greater than the first dimension D1. If, for example, the portion of the bottom layer 34 disposed in the cut 32 experienced some loss during the etch processes of FIGS. 4A-B and/or 5A-B, the step difference D3 can be greater than the first dimension D1. In an example where the bottom layer 34 is a polymer oxide, a plasma etch process may be used for the isotropic etch, and the plasma etch may include a combination of oxygen ($O_2$) gas, nitrogen ($N_2$) gas, chlorine ($Cl_2$) gas, hydrogen bromide (HBr) gas at a ratio of 2:1:1:1 ($O_2$:$N_2$:$Cl_2$:HBr). Other etch processes with different etch chemistries may be used.

FIGS. 7A and 7B illustrate the intermediate structure of FIGS. 6A and 6B after further processing. FIGS. 7A and 7B illustrate a cross-section view and a top view, respectively, like in FIGS. 6A and 6B. In FIGS. 7A and 7B, and operation 120 of FIG. 14B, an etch process is performed that transfers the pattern of the patterned bottom layer 34 to the underlying dummy mask layer 30 to form dummy mask lines 30a-e (see subsequent figures). Areas where portions of the dummy mask layer 30 were removed similarly have the modified line areas 40a'-d', with the accommodation of the portion of the bottom layer 34 that was disposed in the cut 32, that expose corresponding portions of the mask stack (e.g., third mask sub-layer 28) and/or the portion of the bottom layer 34 that was disposed in the cut 32. The etch process can be any suitable etch process, such as RIE, NBE, the like, or a combination thereof.

FIGS. 8A and 8B illustrate the intermediate structure of FIGS. 7A and 7B after further processing. FIGS. 8A and 8B illustrate a cross-section view and a top view, respectively, like in FIGS. 7A and 7B. In FIGS. 8A and 8B, and operation 122 of FIG. 14B, an ash and/or etch process selective to the material of the bottom layer 34 is performed to remove the remaining portions of the bottom layer 34. The ash and/or etch process may be a plasma-based process.

Dummy mask lines 30a-e (e.g., mandrels) remain above the mask stack. As illustrated, the dummy mask lines 30a-e extend longitudinally along y-directions. As a result of the cut 32 through the dummy mask layer 30, one or more dummy mask lines can be discontinuous in the longitudinal direction. For example, a first section of a second dummy mask line 30b1 and a second section of the second dummy mask line 30b2 do not extend through the cross-section shown by line A-A and illustrated in FIG. 8A. Hence, the second dummy mask line 30b is discontinuous. Similarly, for example, a first section of a third dummy mask line 30c1 and a second section of the third dummy mask line 30c2 do not extend through the cross-section shown by line A-A and illustrated in FIG. 8A. Hence, the third dummy mask line 30c is discontinuous. The first sections of the second and third dummy mask lines 30b1 and 30c1 are shown in phantom in the cross-section of FIG. 8A to illustrate this discontinuity.

FIGS. 9A and 9B illustrate the intermediate structure of FIGS. 8A and 8B after further processing. FIGS. 9A and 9B illustrate a cross-section view and a top view, respectively, like in FIGS. 8A and 8B. In FIGS. 9A and 9B, and operation 124 of FIG. 14B, a spacer layer 42 is formed on the dummy mask lines 30a-e and above the mask stack. The spacer layer 42 is formed conformally on the dummy mask lines 30a-e. The spacer layer 42 may be, for example, titanium oxide, a nitride like silicon nitride, or another acceptable material, and may be formed using CVD, ALD, or another deposition technique. The spacer layer 42 can have a thickness in a range from about 5 nm to about 30 nm, for example.

As previously described, in the illustrated example, the cut 32 through the dummy mask layer 30 causes the second dummy mask line 30b and the third dummy mask line 30c to be discontinuous. Further, the cut 32 forms respective sidewalls of the first and second sections of the second and third dummy mask lines 30b1, 30b2, 30c1, and 30c2 in an x-z plane. If a distance between sidewalls in the respective x-z planes of the first and second sections of the second dummy mask line 30b1 and 30b2 is, for example, equal to or less than two times a thickness of the spacer layer 42, the spacer layer 42 may coalesce between the first and second sections of the second dummy mask line 30b1 and 30b2 due to the formation of the spacer layer 42 on the sidewalls in the x-z planes, which is illustrated by a coalescence region 42b in FIG. 9A. Similarly, if a distance between sidewalls in the x-z planes of the first and second sections of the third dummy mask line 30c1 and 30c2 is, for example, equal to or less than two times a thickness of the spacer layer 42, the spacer layer 42 may coalesce between the first and second sections of the third dummy mask line 30c1 and 30c2, which is illustrated by a coalescence region 42c in FIG. 9A.

FIGS. 10A and 10B illustrate the intermediate structure of FIGS. 9A and 9B after further processing. FIGS. 10A and 10B illustrate a cross-section view and a top view, respectively, like in FIGS. 9A and 9B. In FIGS. 10A and 10B, and operation 126 of FIG. 14B, an anisotropic etch is performed, which can remove substantially lateral portions of the spacer layer 42 to form mask portions 44. The mask portions 44 remain on sidewalls (e.g., in x-z planes and y-z planes) of the dummy mask lines 30a-e after the anisotropic etch. Further, top surfaces of the dummy mask lines 30a-e are exposed by the anisotropic etch, and portions of the mask stack (e.g., the third mask sub-layer 28) between the mask portions 44 that are not covered by a dummy mask line are also exposed. The anisotropic etch can be any appropriate etch, such as an RIE, NBE, the like, or a combination thereof.

FIGS. 11A and 11B illustrate the intermediate structure of FIGS. 10A and 10B after further processing. FIGS. 11A and 11B illustrate a cross-section view and a top view, respectively, like in FIGS. 10A and 10B. In FIGS. 11A and 11B, and operation 128 of FIG. 14B, the dummy mask lines 30a-e are removed. The dummy mask lines 30a-e can be removed by any suitable etch process selective to the material of the dummy mask lines 30a-e, such as a wet etch or a plasma-based etch.

FIGS. 12A and 12B illustrate the intermediate structure of FIGS. 11A and 11B after further processing. FIGS. 12A and 12B illustrate a cross-section view and a top view, respectively, like in FIGS. 11A and 11B. In FIGS. 12A and 12B, and operation 130 of FIG. 14B, the pattern of the mask portions 44 is transferred to the mask stack (e.g., the third mask sub-layer 28, the second mask sub-layer 26, and the first mask sub-layer 24) and into the dielectric layer 22 to form recesses and/or openings in the dielectric layer 22. One or more etch processes may be used to form the recesses and/or openings in the dielectric layer 22. For example, due to different etch selectivities between the mask sub-layers 28, 26, and 24 of the mask stack and the dielectric layer 22, a different etch chemistry may be used to transfer the pattern of the mask portions 44 to a different layer or sub-layer. In some instances, the etch process that etches into the dielectric layer 22 may continue etching the dielectric layer 22 until the etch process reaches an etch stop layer below and adjoining the dielectric layer 22, for example, as indicated previously. Although the mask portions 44 are illustrated as remaining above the mask stack in FIGS. 12A and 12B, various etch processes used in transferring the pattern of the mask portions 44 to the dielectric layer 22 may consume at least partially the mask portions 44 and/or portions of the mask stack.

Figure 13A:
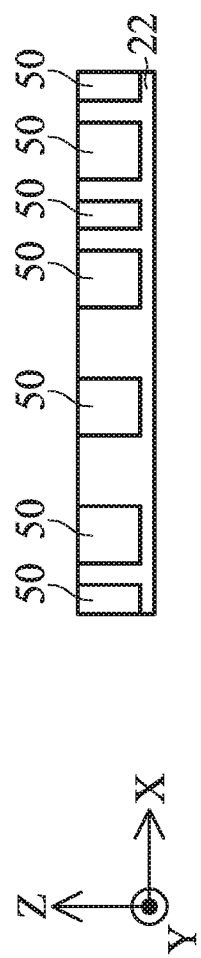
Figure 13B:
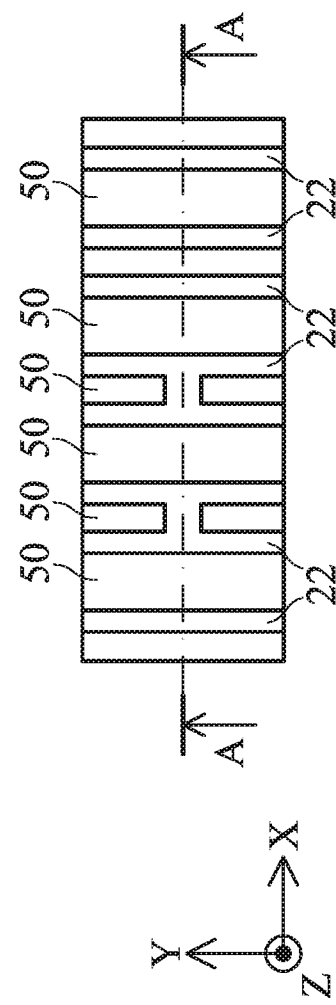
Figure 14A:
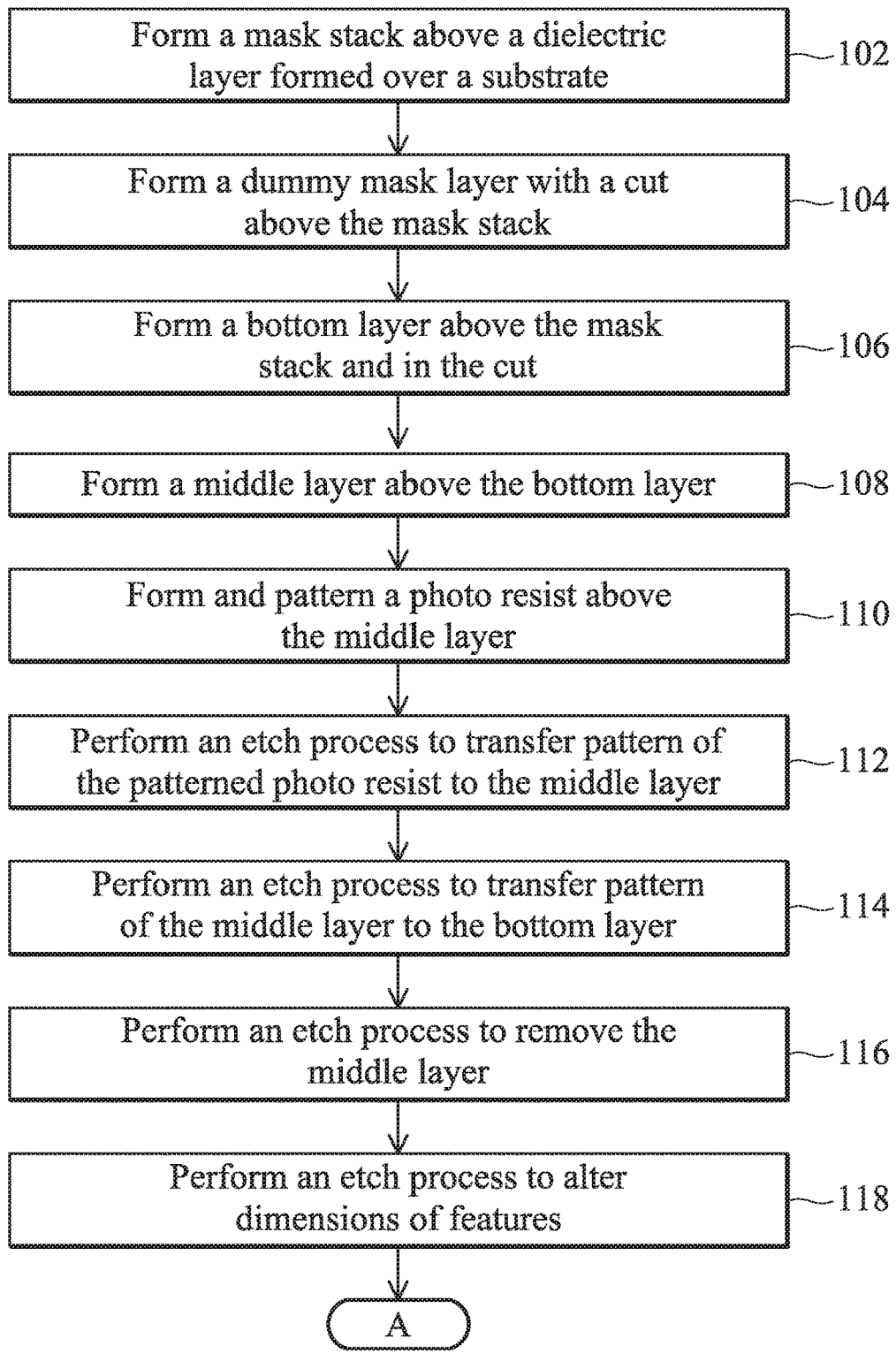
FIGS. 14A and 14B is a flow chart of a method for forming conductive features in a dielectric layer using, for example, a self-aligned double patterning technique, in accordance with some embodiments.
Figure 14B:
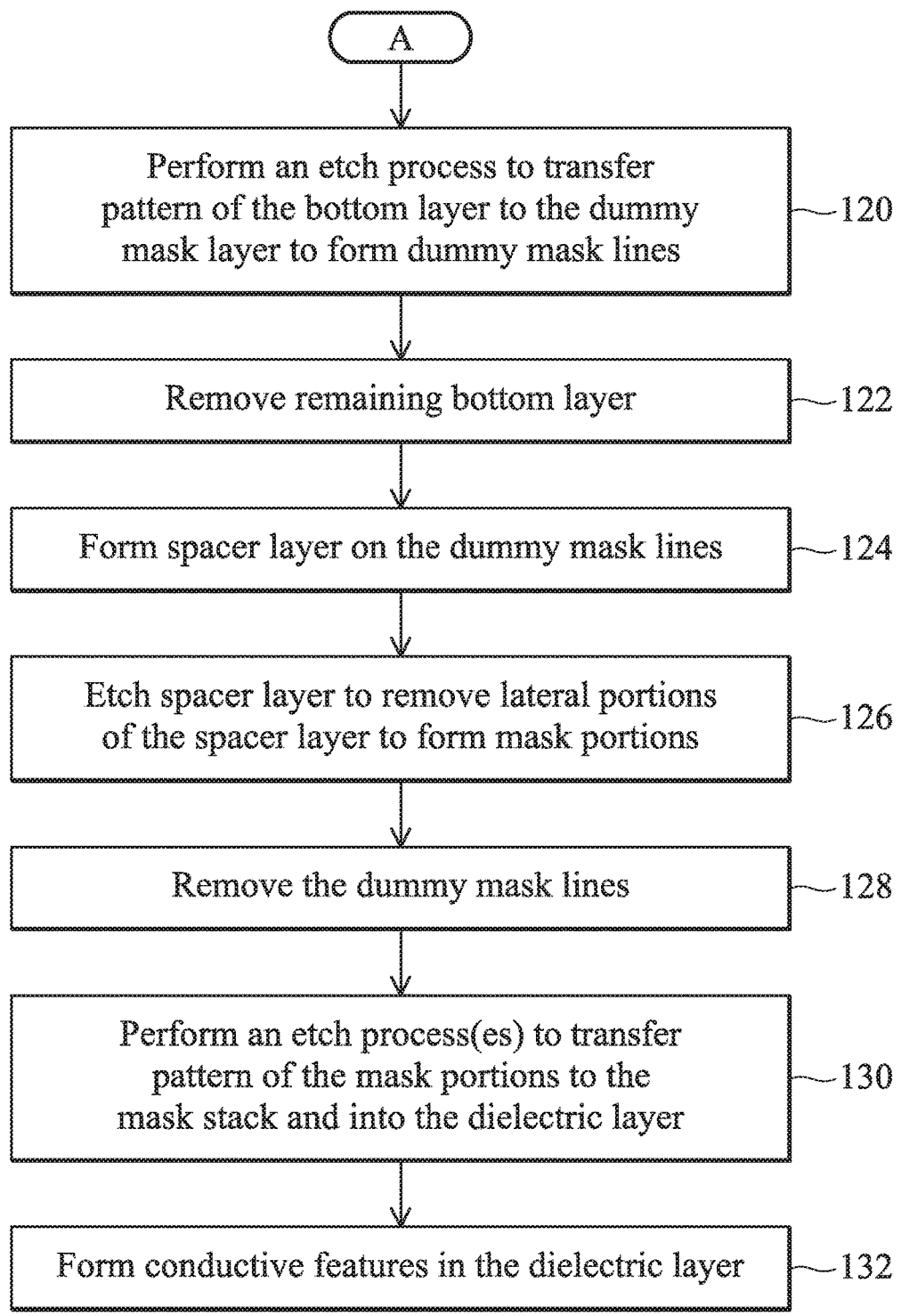

FIGS. 13A and 13B illustrate the intermediate structure of FIGS. 12A and 12B after further processing. FIGS. 13A and 13B illustrate a cross-section view and a top view, respectively, like in FIGS. 12A and 12B. In FIGS. 13A and 13B, and operation 132 of FIG. 14B, conductive features 50 are formed in the dielectric layer 22. For example, a barrier layer, such as titanium nitride, tantalum nitride, or the like, can be conformally deposited in the recesses and/or openings (e.g., along sidewalls and bottom surfaces) in the dielectric layer 22, and a conductive material, such as a metal like copper, tungsten, aluminum, gold, silver, an alloy thereof, the like, or a combination thereof, can be deposited on the barrier layer. The barrier layer may be deposited by any suitable deposition technique, such as ALD, CVD, the like, or a combination thereof, and the conductive material may also be deposited by a suitable deposition technique, such as PVD, CVD, ALD, the like, or a combination thereof. Any excess barrier layer and/or conductive material may be removed, such as by using a CMP to planarize top surfaces of the barrier layer and conductive material to be co-planar with the top surface of the dielectric layer 22. If any of the mask portions 44 and mask stack remain when the barrier layer and/or conductive material are deposited, the CMP may also remove the mask portions 44 and the mask stack. After the CMP, conductive features 50 remain, and the conductive features may be or include conductive lines (e.g., metal lines), conductive vias, and/or conductive contacts. Although not explicitly illustrated in FIG. 13A, the semiconductor substrate 20 is below the dielectric layer 22.

One or more additional dielectric layers may be formed over the dielectric layer 22. Each of the one or more additional dielectric layers may have various conductive features formed therein, which conductive features may further interconnect devices formed on the semiconductor substrate 20 to form the integrated circuit. Those conductive features may be formed using patterning as described above for patterning the dielectric layer 22 or using other patterning techniques. Patterning as described herein, and/or patterning within the scope of various embodiments, may be applied to any interlayer dielectric (ILD) layer and inter-metallization dielectric (IMD) layer in the integrated circuit. Additionally, some embodiments may be implemented in the context of any appropriate multiple patterning, such as self-aligned quadruple patterning (SAQP).

Although some embodiments described herein are in the context of forming conductive features 50 in the dielectric layer 22, some embodiments implementing aspects described herein can be used to form structures in the semiconductor substrate 20. Example structures can include fins or isolation region definitions. These structures can be used to form devices on the semiconductor substrate 20. For example, the mask stack (e.g., the first mask sub-layer 24, the second mask sub-layer 26, and the third mask sub-layer 28) can be formed directly on the semiconductor substrate 20 or formed with other layers disposed therebetween. The mask stack can be patterned as described herein, and the mask stack can be used to pattern the semiconductor substrate 20 with, for example, fins. The fins can be included in the active regions of FinFETs for some devices formed on the semiconductor substrate 20 in some examples.

Some embodiments can achieve advantages. Conductive lines (e.g., metal lines) with line cuts or discontinuities can be achieved with small feature sizes and/or small separation spacings in some examples. Further, for example, by altering dimensions of the patterned bottom layer 34 in the process as shown in FIGS. 6A and 6B, e.g., as opposed to earlier in the process, a risk of collapse of patterned features, such as collapse of photo resist portions 38a-e, may be reduced or eliminated. Collapse of patterned features could result in pattern abnormalities (e.g., a wavy line or a broken line) in the dielectric layer 22, and by reducing a risk of collapse of patterned features, occurrences of pattern abnormalities in the dielectric layer 22 can be reduced or eliminated. Also, undercutting or under-etching a layer inadvertently, such as in the region where the cut 32 was formed, in the process of forming the mask portions 44 can be avoided using some etch processes described herein and in other etch processes within the scope of this disclosure. Having increased etch selectivities when etching various layers may prevent undercutting or under-etching a layer inadvertently. Some embodiments may be particularly advantageous in smaller technology nodes, such as 7 nm, 5 nm, and below, to facilitate more robust processing at those smaller technology nodes.

An embodiment is a multiple patterning method. A dummy layer is formed over a substrate. The dummy layer has a cut therein. A first sacrificial layer is formed over the dummy layer, and at least a portion of the first sacrificial layer is disposed in the cut. A second sacrificial layer is formed over the first sacrificial layer. The second sacrificial layer is patterned to have a first pattern. Using the first pattern of the second sacrificial layer, the first sacrificial layer is patterned to have the first pattern. The second sacrificial layer is removed. After removing the second sacrificial layer, a second pattern in the first sacrificial layer is formed comprising altering a dimension of the first pattern of the first sacrificial layer. Using the second pattern of the first sacrificial layer, the dummy layer is patterned. Mask portions are formed along respective sidewalls of the patterned dummy layer. The mask portions are used to form a mask, and the mask is to be used during etching a layer of the substrate.

Another embodiment is a self-aligned multiple patterning method. A dummy layer is formed over a dielectric layer, and the dummy layer has a cut therein. The dielectric layer is over a substrate. A first sacrificial layer is formed over the dummy layer, and at least a portion of the first sacrificial layer is disposed in the cut. A patterned second sacrificial layer is formed over the first sacrificial layer. Using the patterned second sacrificial layer, the first sacrificial layer is patterned. The patterned second sacrificial layer is removed comprising etching the patterned second sacrificial layer. The etching the patterned second sacrificial layer has a first etch selectivity ratio between the patterned second sacrificial layer to the first sacrificial layer of greater than 10, and the etching the patterned second sacrificial layer has a second etch selectivity ratio between the patterned second sacrificial layer to a layer underlying and contacting the dummy layer of greater than 2. After removing the patterned second sacrificial layer, respective lateral dimensions of portions of the patterned first sacrificial layer are decreased. After decreasing the respective lateral dimensions, the dummy layer is patterned using the patterned first sacrificial layer. Mask portions are formed along respective sidewalls of the patterned dummy layer. The mask portions are used to form a mask, and the mask is to be used during etching in the dielectric layer.

A further embodiment is a self-aligned double patterning method. A mask stack is formed over a dielectric layer, and the dielectric layer is over a semiconductor substrate. A dummy layer is formed over the mask stack, and the dummy layer has a cut therein. A first sacrificial layer is formed over the dummy layer, and a cut portion of the first sacrificial layer is disposed in the cut. A patterned second sacrificial layer is formed over the first sacrificial layer. Using the patterned second sacrificial layer, the first sacrificial layer is patterned. The patterned second sacrificial layer is removed comprising etching the patterned second sacrificial layer. The etching the patterned second sacrificial layer has a first etch selectivity ratio between the patterned second sacrificial layer to the first sacrificial layer of greater than 10, and the etching the patterned second sacrificial layer has a second etch selectivity ratio between the patterned second sacrificial layer to a layer of the mask stack contacting the dummy layer of greater than 2. After removing the patterned second sacrificial layer, the patterned first sacrificial layer is isotropically etched. After isotropically etching the patterned first sacrificial layer, at least a portion of the cut portion of the first sacrificial layer remains disposed in the cut, and the patterned first sacrificial layer includes the at least the portion of the cut portion. After isotropically etching the patterned first sacrificial layer, the dummy layer is patterned using the patterned first sacrificial layer. Mask portions are formed along respective sidewalls of the patterned dummy layer. Using the mask portions, a mask is formed from the mask stack, and the mask is to be used during etching in the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiple patterning method comprising:
   forming a silicon dummy layer over a semiconductor substrate, the silicon dummy layer having a cut therein;
   forming a first sacrificial layer over the silicon dummy layer, at least a portion of the first sacrificial layer being disposed in the cut;
   forming a carbon-containing second sacrificial layer over the first sacrificial layer;
   patterning the carbon-containing second sacrificial layer to have a first pattern;
   using the first pattern of the carbon-containing second sacrificial layer, patterning the first sacrificial layer to have the first pattern;
   removing the carbon-containing second sacrificial layer;
   after removing the carbon-containing second sacrificial layer, forming a second pattern in the first sacrificial layer comprising altering a dimension of the first pattern of the first sacrificial layer;
   using the second pattern of the first sacrificial layer, patterning the silicon dummy layer;
   forming mask portions along respective sidewalls of the patterned silicon dummy layer; and
   using the mask portions as a mask, etching a layer of the semiconductor substrate to form at least recesses.

2. The multiple patterning method of claim 1 further comprising:
   forming at least one mask layer over the layer of the semiconductor substrate, the silicon dummy layer being formed over the at least one mask layer; and
   etching the at least one mask layer using the mask.

3. The multiple patterning method of claim 1, wherein altering the dimension of the first pattern of the first sacrificial layer comprises increasing a lateral spacing between neighboring portions of the first sacrificial layer and decreasing a lateral dimension of at least one portion of the first sacrificial layer.

4. The multiple patterning method of claim 1, wherein altering the dimension of the first pattern of the first sacrificial layer comprises performing an isotropic etch.

5. The multiple patterning method of claim 1, wherein forming the mask portions along the respective sidewalls of the patterned silicon dummy layer comprises:
   conformally depositing a spacer layer along the patterned silicon dummy layer; and
   anistropically etching the spacer layer.

6. The multiple patterning method of claim 1, wherein removing the carbon-containing second sacrificial layer comprises etching the carbon-containing second sacrificial layer, the etching having an etch selectivity ratio between the carbon-containing second sacrificial layer to the first sacrificial layer of greater than 10.

7. The multiple patterning method of claim 1, wherein removing the carbon-containing second sacrificial layer comprises etching the carbon-containing second sacrificial layer, the etching having an etch selectivity ratio between the carbon-containing second sacrificial layer to a layer underlying and contacting the silicon dummy layer of greater than 2.

8. The multiple patterning method of claim 1, wherein:
the first sacrificial layer is a layer of an oxide material, the oxide material being a polymer;
the carbon-containing second sacrificial layer is a layer of SiOC;
a layer underlying and contacting the silicon dummy layer is a layer of tetraethylorthosilicate (TEOS); and
removing the carbon-containing second sacrificial layer comprises etching the carbon-containing second sacrificial layer using a combination of $N_2$ gas, Ar gas, $H_2$ gas, $CF_4$ gas, and $CHF_3$ gas at a flow rate ratio in a range of (20 standard cubic centimeter per minute (sccm) to 100 sccm):(10 sccm to 100 sccm):(70 sccm to 200 sccm):(30 sccm to 150 sccm):(5 sccm to 80 sccm) ($N_2$:Ar:$H_2$:$CF_4$:$CHF_3$).

9. The multiple patterning method of claim 1 further comprising:
forming respective conductive lines in the at least recesses, at least one of the conductive lines traversing a region corresponding to the cut in the silicon dummy layer, the at least one of the conductive lines being discontinuous at the region.

10. A self-aligned multiple patterning method comprising:
forming a silicon dummy layer over a dielectric layer, the silicon dummy layer having a cut therein, the dielectric layer being over a semiconductor substrate;
forming a first sacrificial layer over the silicon dummy layer, at least a portion of the first sacrificial layer being disposed in the cut;
forming a patterned carbon-containing second sacrificial layer over the first sacrificial layer;
using the patterned carbon-containing second sacrificial layer, patterning the first sacrificial layer;
removing the patterned carbon-containing second sacrificial layer comprising etching the patterned carbon-containing second sacrificial layer, the etching the patterned carbon-containing second sacrificial layer having a first etch selectivity ratio between the patterned carbon-containing second sacrificial layer to the first sacrificial layer of greater than 10, the etching the patterned carbon-containing second sacrificial layer having a second etch selectivity ratio between the patterned carbon-containing second sacrificial layer to a layer underlying and contacting the silicon dummy layer of greater than 2;
after removing the patterned carbon-containing second sacrificial layer, decreasing respective lateral dimensions of portions of the patterned first sacrificial layer;
after decreasing the respective lateral dimensions, patterning the silicon dummy layer using the patterned first sacrificial layer;
forming mask portions along respective sidewalls of the patterned silicon dummy layer; and
using the mask portions as a first mask, forming a second mask to be used during etching the dielectric layer.

11. The self-aligned multiple patterning method of claim 10 further comprising:
forming a mask stack over the dielectric layer, the silicon dummy layer being formed over the mask stack;
forming the second mask from the mask stack using the first mask; and
etching the dielectric layer using the second mask.

12. The self-aligned multiple patterning method of claim 10, wherein forming the mask portions along the respective sidewalls of the patterned silicon dummy layer comprises:
conformally depositing a spacer layer along the patterned silicon dummy layer; and
anistropically etching the spacer layer.

13. The self-aligned multiple patterning method of claim 10, wherein:
the first sacrificial layer is a layer of an oxide material, the oxide material being a polymer;
the patterned carbon-containing second sacrificial layer is a layer of SiOC;
the layer underlying and contacting the silicon dummy layer is a layer of tetraethylorthosilicate (TEOS); and
the etching the patterned carbon-containing second sacrificial layer uses a combination of $N_2$ gas, Ar gas, $H_2$ gas, $CF_4$ gas, and $CHF_3$ gas at a flow rate ratio in a range of (20 standard cubic centimeter per minute (sccm) to 100 sccm):(10 sccm to 100 sccm):(70 sccm to 200 sccm):(30 sccm to 150 sccm):(5 sccm to 80 sccm) ($N_2$:Ar:$H_2$:$CF_4$:$CHF_3$).

14. The self-aligned multiple patterning method of claim 10 further comprising:
etching in the dielectric layer to form at least recesses using the second mask; and
forming respective conductive lines in the at least recesses, at least one of the conductive lines traversing a region corresponding to the cut in the silicon dummy layer, the at least one of the conductive lines being discontinuous at the region.

15. The self-aligned multiple patterning method of claim 10, wherein decreasing the respective lateral dimensions of the portions of the patterned first sacrificial layer comprises isotropically etching the patterned first sacrificial layer.

16. A self-aligned double patterning method comprising:
forming a mask stack over a dielectric layer, the dielectric layer being over a semiconductor substrate;
forming a silicon dummy layer over the mask stack, the silicon dummy layer having a cut therein;
forming a first sacrificial layer over the silicon dummy layer, a cut portion of the first sacrificial layer being disposed in the cut;
forming a patterned carbon-containing second sacrificial layer over the first sacrificial layer;
using the patterned carbon-containing second sacrificial layer, patterning the first sacrificial layer;
removing the patterned carbon-containing second sacrificial layer comprising etching the patterned carbon-containing second sacrificial layer, the etching the patterned carbon-containing second sacrificial layer having a first etch selectivity ratio between the patterned carbon-containing second sacrificial layer to the first sacrificial layer of greater than 10, the etching the patterned carbon-containing second sacrificial layer having a second etch selectivity ratio between the patterned carbon-containing second sacrificial layer to a layer of the mask stack contacting the silicon dummy layer of greater than 2;
after removing the patterned carbon-containing second sacrificial layer, isotropically etching the patterned first sacrificial layer, wherein after isotropically etching the patterned first sacrificial layer, at least a portion of the cut portion of the first sacrificial layer remains disposed in the cut, the patterned first sacrificial layer comprising the at least the portion of the cut portion;

after isotropically etching the patterned first sacrificial layer, patterning the silicon dummy layer using the patterned first sacrificial layer;

forming mask portions along respective sidewalls of the patterned silicon dummy layer; and using the mask portions as a first mask, etching the mask stack to form a second mask, the second mask to be used during etching in the dielectric layer.

17. The self-aligned double patterning method of claim 16, wherein forming the mask portions along the respective sidewalls of the patterned silicon dummy layer comprises:

conformally depositing a spacer layer along the patterned silicon dummy layer; and anistropically etching the spacer layer.

18. The self-aligned double patterning method of claim 16, wherein:

the first sacrificial layer is a layer of an oxide material, the oxide material being a polymer;

the patterned carbon-containing second sacrificial layer is a layer of SiOC;

the layer of the mask stack contacting the silicon dummy layer is a layer of tetraethylorthosilicate (TEOS); and the etching the patterned carbon-containing second sacrificial layer uses a combination of $N_2$ gas, Ar gas, $H_2$ gas, $CF_4$ gas, and $CHF_3$ gas at a flow rate ratio in a range of (20 standard cubic centimeter per minute (sccm) to 100 sccm):(10 sccm to 100 sccm):(70 sccm to 200 sccm):(30 sccm to 150 sccm):(5 sccm to 80 sccm) ($N_2$:Ar:$H_2$:$CF_4$:$CHF_3$).

19. The self-aligned double patterning method of claim 16, wherein:

the layer of the mask stack contacting the silicon dummy layer is a layer of tetraethylorthosilicate (TEOS); and the layer of TEOS is not etched through before forming the second mask.

20. The self-aligned double patterning method of claim 16 wherein the patterned carbon-containing second sacrificial layer comprises separate line portions of the patterned carbon-containing second sacrificial layer.

* * * * *